United States Patent
Kim et al.

(10) Patent No.: US 6,842,382 B2
(45) Date of Patent: Jan. 11, 2005

(54) INTERNAL VOLTAGE GENERATING CIRCUIT FOR PERIPHERY, SEMICONDUCTOR MEMORY DEVICE HAVING THE CIRCUIT AND METHOD THEREOF

(75) Inventors: Jae-Hoon Kim, Kyungki-do (KR); Jae-Youn Youn, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 156 days.

(21) Appl. No.: 10/217,799

(22) Filed: Aug. 12, 2002

(65) Prior Publication Data

US 2003/0035325 A1 Feb. 20, 2003

(30) Foreign Application Priority Data

Aug. 14, 2001 (KR) ......................................... 2001-49038

(51) Int. Cl.[7] .............................................. G11C 16/04
(52) U.S. Cl. .................................. 365/189.09; 365/226
(58) Field of Search .......................... 365/189.09, 226, 365/203, 207; 327/546

(56) References Cited

U.S. PATENT DOCUMENTS 5,627,493 A * 5/1997 Takeuchi et al. ............ 327/546
6,021,082 A * 2/2000 Shirai ........................ 365/226
6,392,951 B2 * 5/2002 Fujima et al. .......... 365/230.03
6,496,438 B2 * 12/2002 Saito .......................... 365/226
6,704,237 B2 * 3/2004 Park .......................... 365/226

* cited by examiner

*Primary Examiner*—Anh Phung
(74) *Attorney, Agent, or Firm*—Marger Johnson & McCollom

(57) ABSTRACT

An internal voltage generator for memory bank peripheral circuitry, a semiconductor memory device having the internal voltage generator, and a method for generating an internal voltage are provided. A switchable internal voltage generating circuit according to the present invention includes a control section and an internal voltage generating circuit. The control section generates a control signal in response to a bank activation command and a bank activation signal for enabling memory banks. The internal voltage generating circuit receives a reference voltage, and responds to the control signal to output an internal voltage equal to the reference voltage. The control signal is enabled when the bank activation command and the bank activation signal are concurrently enabled. The bank activation signal is generated in response to a bank address. The internal voltage can be supplied only to peripheral circuits of the banks selected by the bank address, thereby preventing unnecessary power consumption, effectively controlling the internal voltage, and always properly supplying the internal voltage.

30 Claims, 3 Drawing Sheets

INTERNAL VOLTAGE GENERATING CIRCUIT FOR PERIPHERY, SEMICONDUCTOR MEMORY DEVICE HAVING THE CIRCUIT AND METHOD THEREOF

BACKGROUND OF THE INVENTION

1. Field of the Invention

The present invention relates to a semiconductor memory device, and more particularly, to an internal voltage generating circuit for receiving an external voltage having a predetermined level and converting the external voltage into an internal voltage to supply power to peripheral circuits of banks, a semiconductor memory device having the internal voltage generating circuit, and a method for generating an internal voltage.

2. Description of the Related Art

Recently, an internal voltage generating circuit for maintaining an internal power voltage at a predetermined level independent of an external power voltage has been used in semiconductor memory devices operating in the region of 3V to 6V to improve properties such as high-speed operation and low operating current. With the increased operating current drawn by semiconductor products that are designed to operate at a low supply voltage of 3.3V using an external voltage (EVC), semiconductor products solving these problems using an internal voltage generating circuit have been favored.

In a memory circuit, the internal voltage generating circuit includes an internal voltage generating circuit for the memory array and an internal voltage generating circuit for the peripheral circuits.

The internal voltage generating circuit for the memory array supplies a predetermined voltage required for storing data in a memory array bank or for reading data from the memory array bank.

The internal voltage generating circuit for the peripheral circuits supplies a predetermined voltage required for operating peripheral circuits of banks (but not the memory array bank): for example, decoders, input buffers, output buffers, and input and output lines. The internal voltage generating circuit for the peripheral circuits includes: a standby internal voltage generating circuit that operates continually after power is turned on; and an active internal voltage generating circuit that operates only when a memory bank is enabled.

In prior art peripheral-circuit internal voltage generator implementations, an internal voltage has been supplied to the peripheral circuits independent of memory bank operation the state of the internal voltage generator has been classified only into an active state and a standby state. It is recognized herein that problems can arise with such implementations, problems such as power being supplied when the peripheral circuits are not needed, or insufficient power being supplied at other times.

SUMMARY OF THE INVENTION

One aspect of the disclosure is a description of internal voltage generators that operate based on a bank address, such that power can be shut off to peripheral circuits serving non-addressed banks, thereby preventing unnecessary power consumption.

In a second aspect of the disclosure, a memory device using bank-addressed internal voltage generators is disclosed.

A third aspect of the disclosure describes a method for generating an internal voltage when a given bank address is received.

According to the first aspect of the disclosure, there is described an internal voltage generator comprising a control section and a switchable internal voltage generating circuit.

The control section switches on the internal voltage generating circuit, in response to a bank activation command and a bank activation signal.

The internal voltage generating circuit receives a predetermined reference voltage, and when switched on, outputs an internal voltage equal to the reference voltage. In some embodiments, the internal voltage generating circuit is switched on when the bank activation command and the bank activation signal are concurrently enabled. In other embodiments, the internal voltage generating circuit enters a first switched-on state when the bank activation command is enabled, and a second switched-on state (e.g., that can supply additional power) when the bank activation command and the bank activation signal are concurrently enabled. The bank activation signal is generated in response to a bank address.

In some embodiments, the switchable internal voltage generating circuit further includes a level converter for precharging the internal voltage generating circuit.

In accordance with the second aspect of the disclosure, embodiments of semiconductor memory devices are disclosed. The semiconductor memory devices include a plurality of memory banks for storing data, each bank having peripheral circuitry, and a plurality of switchable internal voltage generating circuits for supplying an internal voltage to the peripheral circuitry of corresponding memory banks in response to a bank activation command and a bank activation signal.

The semiconductor memory device can further include a secondary internal voltage generating circuit for supplying an internal voltage to peripheral circuits of the banks in response to a bank activation command for enabling the banks. The secondary internal voltage generating circuit can be used in conjunction with the switchable internal voltage generating circuits to supply appropriate power levels to the peripheral circuits in different operational states.

In accordance with the third aspect of the disclosure, a method for supplying power to the memory bank peripheral circuits of a semiconductor device is disclosed. The method associates at least one of a plurality of switchable internal voltage generators with each memory bank of the device. An associated internal voltage generator supplies power (when activated) to the peripheral circuits of its associated memory bank. Further according to the method, a selection of which (if any) internal voltage generators should be turned on is made, the selection depending on the state of the bank activation command and a bank address. The selected internal voltage generators are then turned on.

Thus according to the disclosed embodiments, the internal voltage can be supplied only to peripheral circuits of selected banks, as needed, thereby preventing unnecessary power consumption, effectively controlling the internal voltage, and always properly supplying the internal voltage.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
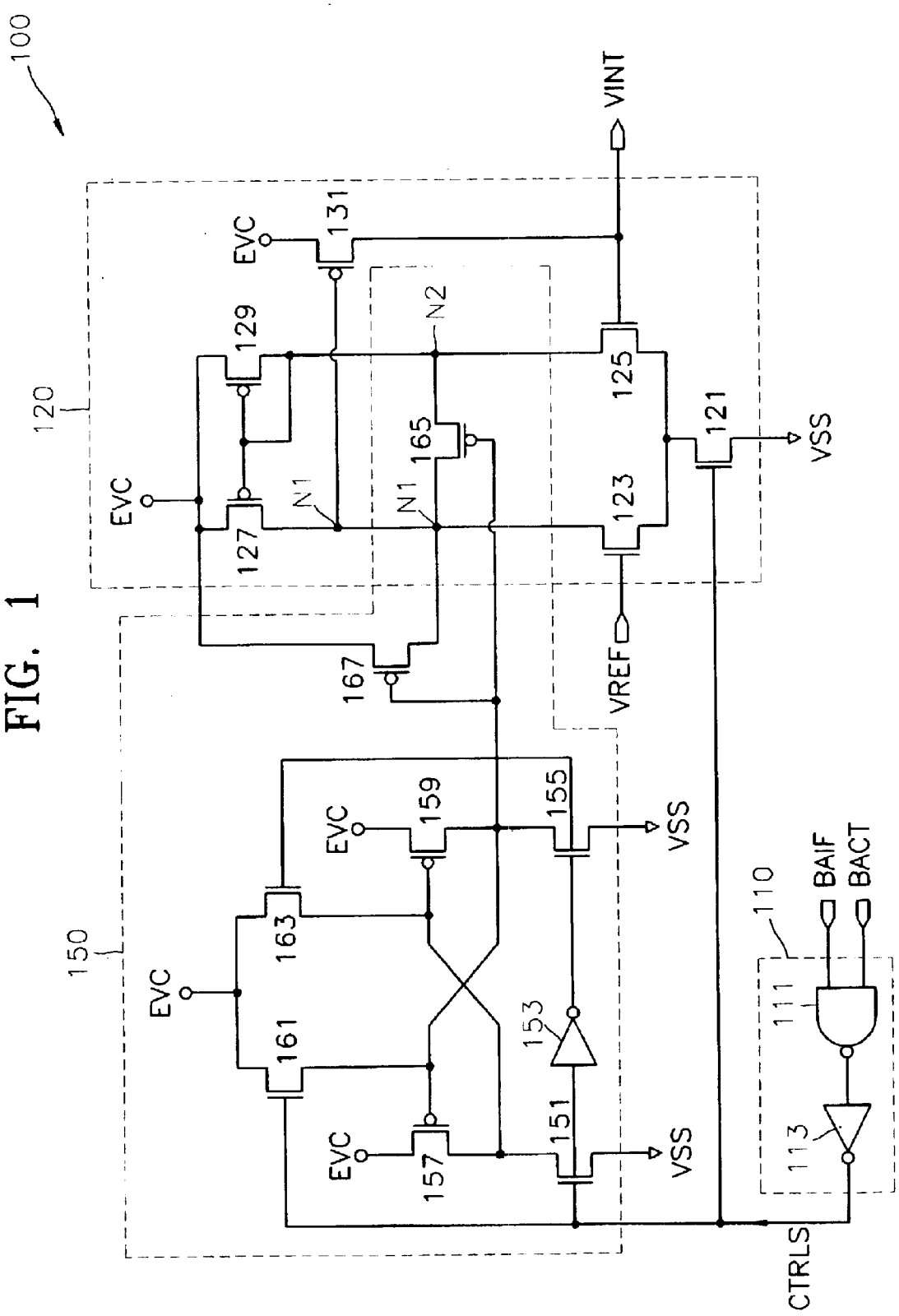
FIG. 1 is a circuit diagram illustrating a switchable internal voltage generating circuit according to a first embodiment of the present invention.

Hereinafter, the present invention will be described in detail with reference to the accompanying drawings. Like reference numerals refer to like elements throughout the drawings.

Referring to FIG. 1, a switchable internal voltage generator 100 according to a first embodiment of the present invention includes a control section 110 to generate a control signal CTRLS in response to a bank activation command BACT and a bank activation signal BAIF (which enables memory access to a given memory bank), and an internal voltage generating circuit 120 to respond to the control signal CTRLS. Circuit 120 receives a reference voltage VREF, and when switched on maintains an internal voltage VINT equal to the reference voltage VREF.

The control signal CTRLS is enabled when the bank activation command BACT and the bank activation signal BAIF are concurrently enabled.

The operation of the switchable internal voltage generating circuit 100 will now be described with reference to FIG. 1.

The bank activation command BACT is an external command for enabling banks in a semiconductor memory device. When banks are selected by a bank address after the bank activation command BACT is applied, the selected banks are enabled.

The bank activation signal BAIF is a signal generated in response to the bank address and corresponding to the bank address, by a decoding means (see decoder 350 of FIG. 3) that is enabled when the bank address is input. In such a case, the bank activation signal BAIF can be enabled to a high level or to a low level. That is, the bank address is for operating banks that are ready to operate, having received the bank activation command BACT; the bank activation signal BAIF is generated in response to the bank address; and the bank activation signal BAIF initiates supply of an internal voltage to peripheral circuits of banks corresponding to the bank address.

The controller 110 generates the predetermined control signal CTRLS in response to the bank activation command BACT and the bank activation signal BAIF. That is, when the bank activation command BACT and the bank activation signal BAIF are concurrently enabled, the control signal CTRLS is enabled and the internal voltage generating portion 120 is switched on.

More specifically, the controller 110 includes a NAND means 111 for performing an AND operation of the bank activation command BACT and the bank activation signal BAIF and inverting the result, and an inverter 113 for inverting the output of the NAND means 111 to control the control signal CTRLS. The inverter 113 inverts the output signal of the NAND means 111 and strengthens driving ability.

When the bank activation signal BAIF and the bank activation command BACT are enabled to a high level, the control signal CTRLS is generated at a high level. The controller 110 can be implemented as shown, or as any other circuit for enabling the control signal CTRLS when the bank activation command BACT and the bank activation signal BAIF are enabled.

The internal voltage generating circuit 120 receives the reference voltage VREF, and responds to the enabled control signal CTRLS by outputting the internal voltage VINT equal to the reference voltage VREF. The internal voltage generating circuit 120 can be a differential amplifier for receiving the reference voltage VREF.

The structure and operation of the internal voltage generating circuit 120 will be now described.

The internal generating circuit 120 includes NMOS transistors 121, 123, and 125, and PMOS transistors 127, 129, and 131. The NMOS transistor 121 serves as a current source for keeping a constant current flowing through the internal voltage generating circuit 120. The gate of the NMOS transistor 123 connects to the reference voltage VREF, and the gate of the NMOS transistor 125 connects to the internal voltage VINT output.

The gates of PMOS transistors 127 and 129 are connected to each other and to the drain of the NMOS transistor 125, that is, to the voltage at second node N2. When the drain voltage of the NMOS transistor 125 is at a high level, the PMOS transistors 127 and 129 are turned off. When the drain voltage of the NMOS transistor 125 is at a low level, the PMOS transistors 127 and 129 are turned on. The gated of PMOS transistor 131 is connected to the drain of the NMOS transistor 123, that is, to the voltage at first node N1. When the drain voltage of the NMOS transistor 123 is at a high level, the PMOS transistor 131 is turned off. When the drain voltage of the NMOS transistor 123 is at a low level, the PMOS transistor 131 is turned on. An external voltage (EVC) is applied to the sources of the PMOS transistors 127, 129, and 131, and the source of the NMOS transistor 121 is connected to a ground voltage VSS.

The operation of the internal voltage generating circuit 120 will be now described. Initially, the NMOS transistor 121 is turned off. When the control signal CTRLS is at a high level, higher than the threshold voltage of the NMOS transistor 121, the NMOS transistor 121 is turned on. When the reference voltage VREF is applied and is higher than the threshold voltage of the NMOS transistor 123, the NMOS transistor 123 is turned on. The reference voltage VREF is set to be higher than the threshold voltage of the NMOS transistor 123. When the NMOS transistors 121 and 123 are turned on, the drain voltage of the NMOS transistor 123 is at a low level. Thus, the PMOS transistor 131 is turned on, and the internal voltage VINT, as the output of the internal voltage generating circuit 120, is generated at the drain of the PMOS transistor 131.

When the internal voltage VINT of the internal voltage generating circuit 120 increases and is higher than the reference voltage VREF, the NMOS transistor 125 is turned on more than the NMOS transistor 123. Then, a voltage generated at the drain of the NMOS transistor 125 is reduced to a low level. Thus, the PMOS transistors 127 and 129 are turned on more, and the drain voltage of the NMOS transistor 123 increases from a low level to a high level. Thus, the PMOS transistor 131 is turned on less. When the PMOS transistor 131 is turned on less, the internal voltage VINT, as the output of the internal voltage generating portion 120, is reduced, and thus, the NMOS transistor 125 is turned off less than the NMOS transistor 123. Then, the drain voltage of the NMOS transistor 123 is reduced, and the PMOS transistor 131 is turned on, and thus, the internal voltage VINT of the internal voltage generating circuit 120 increases. Repeating these steps, the internal voltage VINT of the internal voltage generating circuit 120 is maintained equal to the reference voltage VREF as long as the reference voltage VREF is continuously applied.

The NMOS transistor 121 is turned on or off by the control signal CTRLS, and thus, the internal voltage generating circuit 120 operates only when the bank activation signal BAIF and the bank activation command BACT are enabled. That is, since only the switchable internal voltage generating circuit 100 (which is selected by the bank address and corresponds to the banks that are selected) supplies the internal voltage VINT to peripheral circuits of the banks, unnecessary power consumption can be prevented.

The switchable internal voltage generating circuit 100 further includes a level converter 150 for precharging the internal voltage generating circuit 120.

The structure of the level converter 150 will be now described.

The level converter 150 includes NMOS transistors 151, 155, 161, and 163, PMOS transistors 157, 159, 165, and 167, and an inverter 153.

The PMOS transistor 157 and the NMOS transistor 151 are connected in series between the external voltage EVC and the ground voltage VSS.

The PMOS transistor 159 and the NMOS transistor 155 are also connected in series between the EVC and the VSS. The gate of PMOS transistor 157 is connected to the drain voltage of the NMOS transistor 155, and the gate of PMOS transistor 159 is connected to the drain voltage of the NMOS transistor 151. The EVC is applied to the drains of the NMOS transistors 161 and 163, and the sources of the NMOS transistors 161 and 163 are connected to the gates of the PMOS transistors 157 and 159. The gates of NMOS transistors 151 and 161 are driven by the control signal CTRLS, and the gates of NMOS transistors 155 and 163 are driven by the inverse of the control signal CTRLS, output by the inverter 153. The gates of PMOS transistors 165 and 167 are connected to the drain voltage of the NMOS transistor 155.

The operation of the level converter 150 will be now described.

When the control signal CTRLS is at a low level, the NMOS transistor 155 is turned on, and the drain voltage of the NMOS transistor 155 is at a low level. Then, the PMOS transistor 157 is turned on, and the drain voltage of the NMOS transistor 151 is at a high level, and the PMOS transistor 159 is turned off. In such a case, the NMOS transistor 163 is turned on, and thus, the gate of the PMOS transistor 159 is fixed to a high level. The drain voltage of the NMOS transistor 155 is at a low level, the PMOS transistors 165 and 167 are turned on. The turned-on PMOS transistors 165 and 167 precharge the first node N1 to the EVC and equalize the first node N1 and the second node N2 to the same EVC. The PMOS transistor 131, of which the gate is connected to the first node N1, is turned off. Since the control signal CTRLS is at a low level, the NMOS transistor 121 is turned off, and thus, the internal voltage generating circuit 120 does not operate.

When the control signal CTRLS is enabled to a high level, the NMOS transistor 151 and the PMOS transistor 159 are turned on, and the PMOS transistors 165 and 167 are turned off. Thus, the internal voltage generating circuit 120 operates.

Due to the above-mentioned operations of the control section 110, the internal voltage generating circuit 120, and the level converter 150, the switchable internal voltage generator 100 can supply the internal voltage VINT to peripheral circuits of banks when those banks are selected, and unnecessary power consumption can be prevented.

Figure 2:
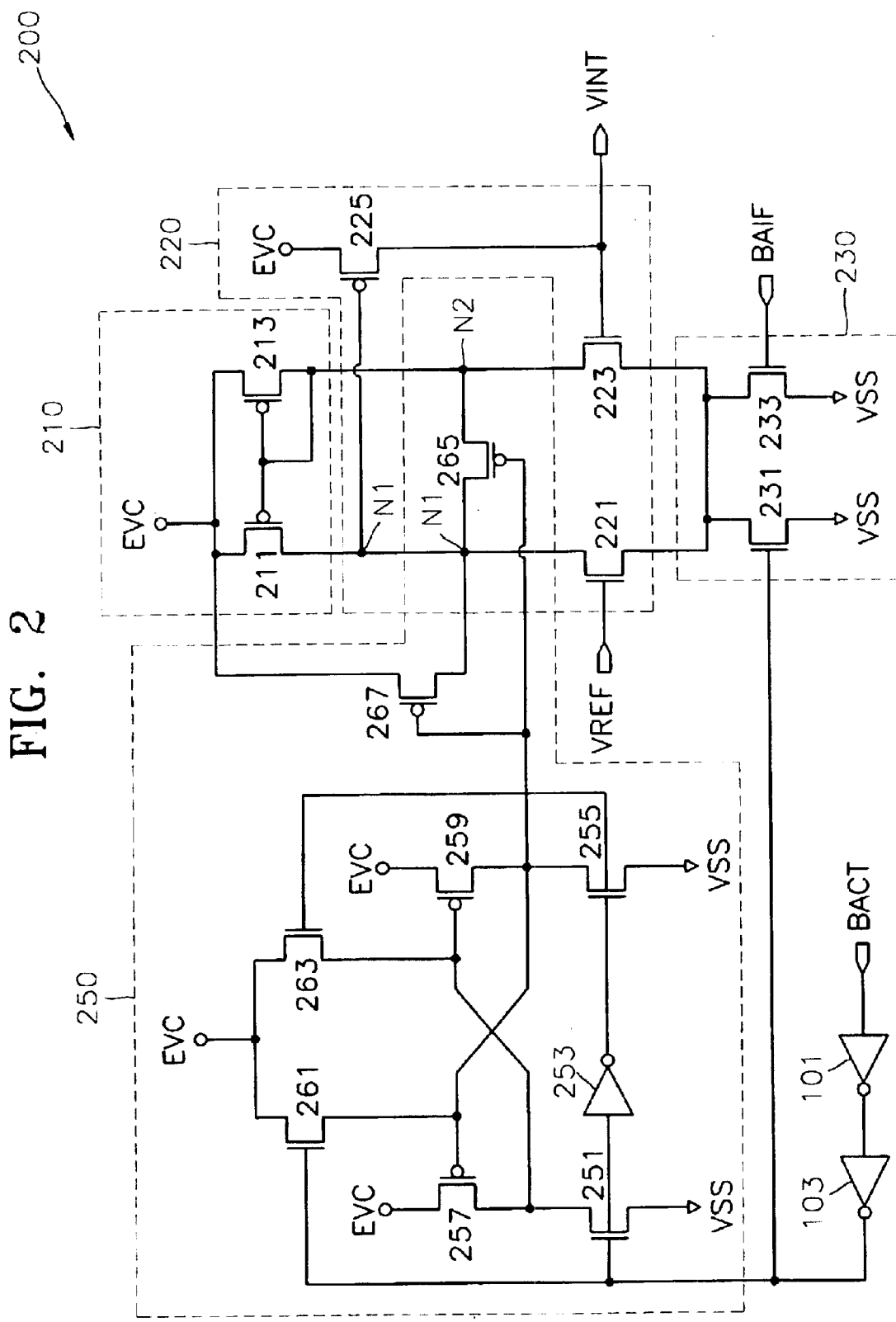
FIG. 2 is a circuit diagram illustrating a switchable internal voltage generating circuit according to a second embodiment of the present invention.

Referring to FIG. 2, a switchable internal voltage generator 200 according to a second embodiment of the present invention includes a current mirror 210, a differential amplifier and input section 220, and a current sink 230.

The current mirror 210 is connected to an external voltage (EVC) and includes first and second MOS transistors 211 and 213, forming a current mirror.

The differential amplifier and input section 220 includes a third MOS transistor 221, having a gate connected to a reference voltage (VREF), a fourth MOS transistor 223, having a gate connected to an internal voltage (VINT) to be controlled equal to the reference voltage (VREF), and a fifth MOS transistor 225 that is connected between the EVC and the gate of the fourth MOS transistor 223 and has its gate connected to one end of the first MOS transistor 211.

The current sink 230 is controlled by a bank activation command BACT and a bank activation signal BAIF, and controls VINT in response to the bank activation signal BAIF.

More specifically, the current sink 230 includes a sixth MOS transistor 231 connected between a ground voltage VSS and one end of the third MOS transistor 221 and having the bank activation command BACT applied to its gate, and a seventh MOS transistor 233 connected between the ground voltage VSS and one end of the fourth MOS transistor 223 and having the bank activation signal BAIF applied to its gate. The seventh MOS transistor 233 can be an NMOS transistor or a PMOS transistor.

The operation of the switchable internal voltage generator 200 according to a second embodiment of the present invention will now be described in detail with reference to FIG. 2. The bank activation command BACT is an external command for enabling all banks in a semiconductor memory device, like in the first embodiment shown in FIG. 1. Banks selected by the bank address are enabled after the bank activation command BACT is applied.

The bank activation command BACT is applied to the gate of the sixth MOS transistor 231 through two inverters 101 and 103. The two inverters 101 and 103 strengthen driving ability of the bank activation command BACT. The sixth MOS transistor 231 can be an NMOS transistor or a PMOS transistor and is an NMOS transistor in the second embodiment shown in FIG. 2.

When the bank activation command BACT is applied at a high level, the NMOS transistor 231 is turned on, and thus, the internal voltage VINT is generated. The operation of the switchable internal voltage generator 200, comprising the current mirror 210, the differential amplifier and input section 220, and the current sink 230, is similar to that of the switchable internal voltage generating circuit 100 according to the first embodiment of the present invention, and thus, a detailed description thereof is omitted.

When the bank activation signal BAIF generated by the bank address is applied at a high level, the NMOS transistor 233 is turned on. Then, the drain voltage of the NMOS transistor 231 is reduced more, and the PMOS transistor 225 can be turned on more. Thus, the range of power that can be generated at the internal voltage VINT increases. That is, the power output from the switchable internal voltage generating circuit 200 is controlled by the bank activation signal BAIF. Thus, the internal voltage VINT supplied to peripheral circuits can be properly controlled according to the operation of banks.

The switchable internal voltage generator 200 can further include a level converter 250 for precharging the switchable internal voltage generator 200. The structure and operation of the level converter 250 are the same as those of the level converter 150 in the first embodiment, and thus, a detailed description thereof is omitted.

Figure 3:
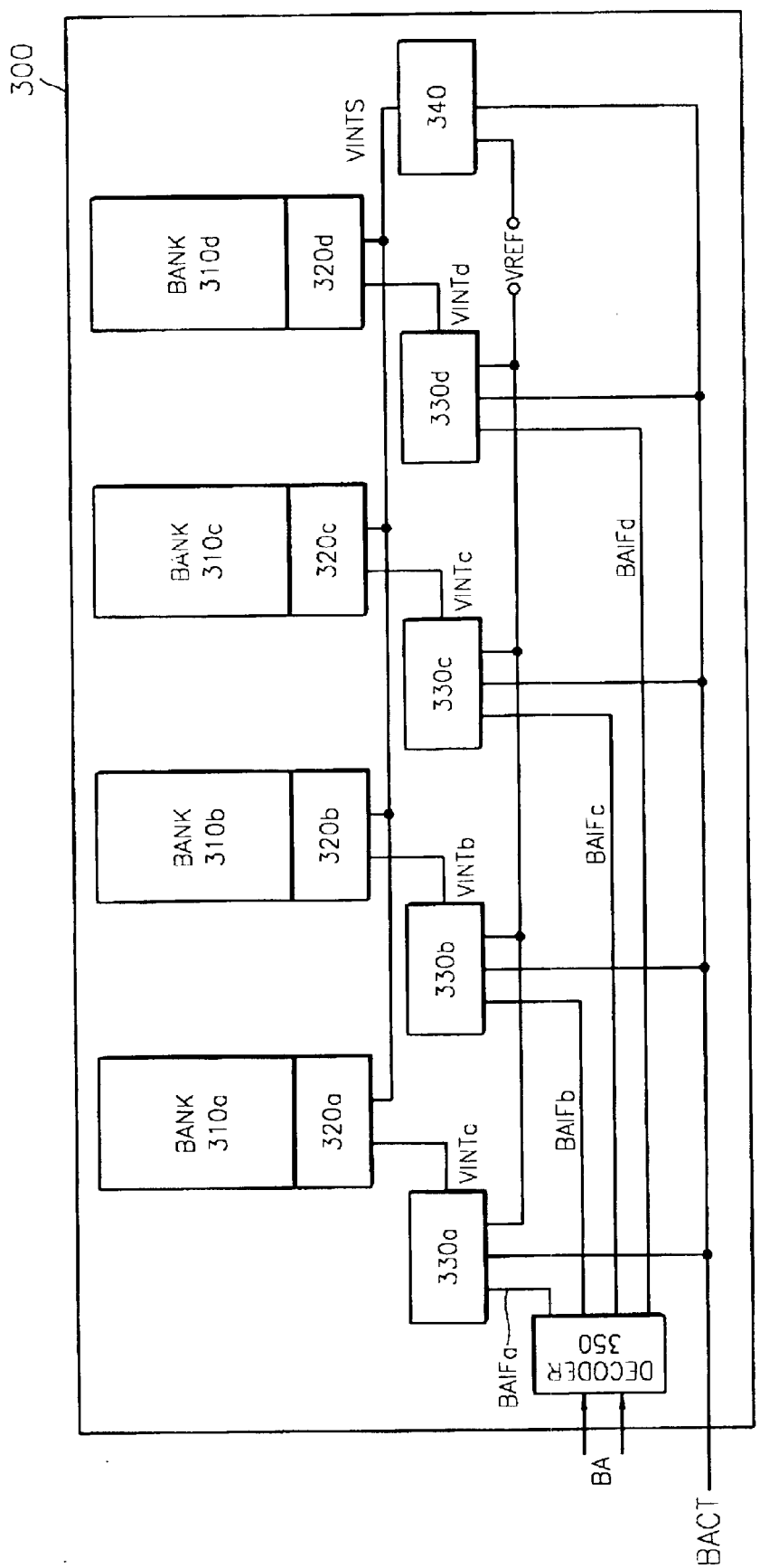
FIG. 3 is a simplified block diagram of a semiconductor memory device according to an embodiment of the present invention.

FIG. 3 illustrates a semiconductor memory device 300 according to an embodiment of the present invention. Device 300 includes a plurality of switchable internal voltage generators 330a–d for supplying, respectively, an internal voltage VINTa–d to peripheral circuits 320a–d of banks 310a–d in response to a bank activation command BACT and a predetermined bank activation signal BAIFa–d. The semiconductor memory device can further include a decoder 350, for decoding the input bank address BA and selecting the bank activation signal BAIFa–d corresponding to the bank address, in order to generate a plurality of the bank activation signals BAIFa–d to drive the plurality of the switchable internal voltage generators 100 in response to the bank address BA.

The structure of each switchable internal voltage generator 330a–d can be the same as that shown in FIG. 1, and thus, a detailed description thereof is omitted. One switchable internal voltage generator as shown in FIG. 1 is installed for each memory bank 310a–d, and supplies the internal voltage VINTa–d to the peripheral circuits of that memory bank. Likewise, the semiconductor memory device includes a plurality of the switchable internal voltage generators 100 which are turned on or off in response to the bank activation signals BAIFa–d generated by the bank address, thereby preventing unnecessary power consumption.

The semiconductor memory device can further include a secondary internal voltage generator 340 for supplying the internal voltage VINTS to peripheral circuits 330a–d of banks 320a–d in response to the bank activation command BACT, thereby supplying secondary power when used together with the switchable internal voltage generators 330a–d. The internal voltage generator 340 has the same structure as the internal voltage generator 100 shown in FIG. 1, but does not receive the bank activation signal BAIF, and thus, a detailed description thereof is omitted.

The internal voltage VINTS is supplied to the peripheral circuits by internal voltage generator 340, which operates only in response to the bank activation command BACT, and the internal voltage VINTa–d can be further supplied only to peripheral circuits of banks selected by the bank address, by the corresponding switchable internal voltage generating circuit 330a–d that operates in response to the bank activation signal BAIFa–d.

Although FIG. 3 has been described as using the switchable internal voltage generator of FIG. 1, it is understood that an alternative is to implement voltage generators 330a–d using the voltage generator of FIG. 2, or another suitable implementation.

A method for supplying power to memory bank peripheral circuits, according to an embodiment of the present invention, will be now described. In this method, a plurality of switchable internal voltage generators are associated with multiple memory banks, e.g., as shown in FIG. 3.

In this method, a bank activation command BACT and a bank address BA are received. The bank activation command BACT is an external signal for enabling all banks in a semiconductor memory device. When the banks are selected by the bank address BA after the bank activation command BACT is applied, the selected banks operate. In the method, selected internal voltage generators are switched on according to the state of BACT and BA. For example, referring to FIG. 3, initially no voltage generators would be selected. When BACT is enabled, internal voltage generator 340 would be selected and would supply voltage VINTS to peripheral circuits 320a–d. Then, when BA is decoded, decoder 350 enables, e.g., BAIFb, causing voltage generator 330b to supply internal voltage VINTb to peripheral circuit 320b associated with bank 310b.

As described above, in the switchable internal voltage generating circuit, the semiconductor memory device having the switchable internal voltage generating circuit, and the method for supplying power to peripheral circuits according to the present invention, the internal voltage can be supplied only to peripheral circuits of banks that are selected to operate by the bank address, thereby preventing unnecessary power consumption, effectively controlling the internal voltage, and always properly supplying the internal voltage. While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An internal voltage generator comprising:
    a switchable internal voltage generating circuit having a reference voltage input and an internal voltage output, the internal voltage generating circuit maintaining the internal voltage output equal to the reference voltage when switched on; and
    a control section to switch on the internal voltage generating circuit in response to a bank activation command and a bank activation signal.

2. The internal voltage generator of claim 1, wherein the bank activation signal is generated in response to a bank address.

3. The internal voltage generator of claim 1, wherein the control section switches the internal voltage generating circuit on only when both the bank activation command and the bank activation signal are enabled.

4. The internal voltage generator of claim 3, wherein the control section comprises a NAND means for performing an AND operation of the bank activation command and the bank activation signal and inverting the result, and an inverter for inverting the output of the NAND means, the inverter supplying a control signal to the internal voltage generating circuit.

5. The internal voltage generator of claim 1, wherein the control section switches the internal voltage generating circuit on when either the bank activation command or the bank activation signal is enabled.

6. The internal voltage generator of claim 5, wherein when both the bank activation command and the bank activation signal are enabled, the internal voltage generating circuit supports a larger range of drive currents at the internal voltage output than it supports with only one of the bank activation command and the bank activation signal enabled.

7. The internal voltage generator of claim 5, wherein the control section comprises first and second MOS transistors connected to the internal voltage generating circuit as parallel current sinks, the bank activation command applied to the gate of the first MOS transistor, the bank activation signal applied to the gate of the second MOS transistor.

8. The internal voltage generator of claim 1, wherein the internal voltage generating circuit comprises a differential amplifier with one differential input connected to the reference voltage input and the other differential input connected to the internal voltage output.

9. The internal voltage generator of claim 1, further comprising a level converter to precharge the internal voltage generating circuit when the internal voltage generating circuit is switched off.

10. The internal voltage generator of claim 1, incorporated into a semiconductor memory device comprising multiple such internal voltage generators and a plurality of memory banks to store data, each bank comprising memory cells and peripheral circuitry, wherein the internal voltage generator is connected to supply an internal voltage to the peripheral circuitry of a corresponding on of the memory banks in response to the bank activation command, the bank activation signal corresponding to that memory bank.

11. The internal voltage generator of claim 1, wherein the switchable internal voltage generating circuit comprises:
a current mirror;
a switchable current source to allow current to flow through the current mirror in response to the bank activation signal and the bank activation command; and
a differential amplifier connected between the current mirror and the switchable current source, the differential amplifier maintaining the internal voltage output equal to the reference voltage when the switchable current source is switched on.

12. The internal voltage generator of claim 11, wherein the current mirror comprises first and second MOS transistors having common sources connected to an external voltage, and common gates connected to the drain of the second MOS transistor; and
the differential amplifier comprises third, fourth, and fifth MOS transistors, the third and fourth MOS transistors having common sources connected to the current source, the third MOS transistor having a gate connected to the reference voltage and a drain connected to the first MOS transistor drain, the fourth MOS transistor having a gate connected to the internal voltage output and a drain connected to the second MOS transistor drain, the fifth MOS transistor having a gate connected to the first MOS transistor drain, a source connected to the external voltage, and a drain connected to the internal voltage output.

13. The internal voltage generator of claim 12, wherein, the switchable current source comprises a sixth MOS transistor having a gate connected to a control signal that is asserted when both the bank activation signal and the bank activation command are asserted.

14. The internal voltage generator of claim 12, wherein, the switchable current source comprises sixth and seventh MOS transistors having common drains and sources, the sixth MOS transistor having a gate coupled to the bank activation command, the seventh MOS transistor having a gate coupled to the bank activation signal.

15. The internal voltage generator of claim 12, further comprising a level converter to precharge that internal voltage generating circuit.

16. An internal voltage generator comprising:
a switchable internal voltage generating circuit having a reference voltage input and an internal voltage output, the internal voltage generating circuit maintaining the internal voltage output equal to the reference voltage when switched on; and
a control section to switch on the internal voltage generating circuit in response to a bank activation command and a first bank activation signal selected from among a plurality of bank activation signals, the control section not switching on the internal voltage generating circuit in response to another of the bank activation signals.

17. The internal voltage generator of claim 16, wherein the first bank activation signal is generated in response to a bank address.

18. The internal voltage generator of claim 16, wherein the control section switches the internal voltage generating circuit on only when both the first bank activation command and the bank activation signal are enabled.

19. The internal voltage generator of claim 18, wherein the control section comprises a NAND means for performing an AND operation of the bank activation command and the first bank activation signal and inverting the result, and an inverter for inverting the output of the NAND means, the inverter supplying a control signal to the internal voltage generating circuit.

20. The internal voltage generator of claim 16, wherein the control section switches the internal voltage generating circuit on when either the bank activation command or the first bank activation signal is enabled.

21. The internal voltage generator of claim 20, wherein when both the bank activation command and the first bank activation signal are enabled, the internal voltage generating circuit supports a larger range of drive currents at the internal voltage output than it supports with only one of the bank activation command and the first bank activation signal enabled.

22. The internal voltage generator of claim 20, wherein the control section comprises first and second MOS transistors connected to the internal voltage generating circuit as parallel current sinks, the bank activation command applied to the gate of the first MOS transistor, the first bank activation signal applied to the gate of the second MOS transistor.

23. The internal voltage generator of claim 16, wherein the internal voltage generating circuit comprises a differential amplifier with one differential input connected to the reference voltage input and the other differential input connected to the internal voltage output.

24. The internal voltage generator of claim 16, further comprising a level converter to precharge the internal voltage generating circuit when the internal voltage generating circuit is switched off.

25. The internal voltage generator of claim 16, incorporated into a semiconductor memory device comprising multiple such internal voltage generators and a plurality of memory banks to store data, each bank comprising memory cells and peripheral circuitry, wherein the internal voltage generator is connected to supply an internal voltage to the peripheral circuitry of a corresponding on of the memory banks in response to the bank activation command, the first bank activation signal corresponding to that memory bank.

26. The internal voltage generator of claim 16, wherein the switchable internal voltage generating circuit comprises:
a current mirror;
a switchable current source to allow current to flow through the current mirror in response to the first bank activation signal and the bank activation command; and
a differential amplifier connected between the current mirror and the switchable current source, the differential amplifier maintaining the internal voltage output equal to the reference voltage when the switchable current source is switched on.

27. The internal voltage generator of claim 26, wherein the current mirror comprises first and second MOS transistors having common sources connected to an external voltage, and common gates connected to the drain of the second MOS transistor; and the differential amplifier comprises third, fourth, and fifth MOS transistors, the third and fourth MOS transistors having common sources connected to the current source, the third MOS transistor having a gate connected to the reference voltage and a drain connected to the first MOS transistor drain, the fourth MOS transistor having a gate connected to the internal voltage output and a drain connected to the second MOS transistor drain, the fifth MOS transistor having a gate connected to the first MOS transistor drain, a source connected to the external voltage, and a drain connected to the internal voltage output.

28. The internal voltage generator of claim 27, wherein, the switchable current source comprises a sixth MOS transistor having a gate connected to a control signal that is asserted when both the first bank activation signal and the bank activation command are asserted.

29. The internal voltage generator of claim 27, wherein, the switchable current source comprises sixth and seventh MOS transistors having common drains and sources, the sixth MOS transistor having a gate coupled to the bank activation command, the seventh MOS transistor having a gate coupled to the first bank activation signal.

30. The internal voltage generator of claim 27, further comprising a level converter to precharge that internal voltage generating circuit.

* * * * *